United States Patent [19]
Prybyla

[11] Patent Number: 6,048,799
[45] Date of Patent: Apr. 11, 2000

[54] DEVICE FABRICATION INVOLVING SURFACE PLANARIZATION

[75] Inventor: Judith Ann Prybyla, Edison, N.J.

[73] Assignee: Lucent Technologies Inc., Murray Hill, N.J.

[21] Appl. No.: 09/131,099

[22] Filed: Aug. 7, 1998

Related U.S. Application Data

[63] Continuation-in-part of application No. 08/695,181, Aug. 1, 1996, Pat. No. 5,736,424, which is a continuation-in-part of application No. 08/245,279, May 18, 1994, abandoned, which is a continuation-in-part of application No. 07/593,362, Oct. 1, 1990, which is a continuation of application No. 07/349,975, May 8, 1989, abandoned, which is a continuation of application No. 07/020,332, Feb. 27, 1987, abandoned

[60] Provisional application No. 60/056,192, Aug. 19, 1997.

[51] Int. Cl.[7] .................................................. H01L 21/312
[52] U.S. Cl. ........................ 438/760; 438/781; 427/370
[58] Field of Search ............................ 427/370; 438/760, 438/781, FOR 391, FOR 409, FOR 493

[56] References Cited

U.S. PATENT DOCUMENTS

| | | |
|---|---|---|
| 4,806,504 | 2/1989 | Cleeves . |
| 5,478,436 | 12/1995 | Winebarger et al. . |
| 5,504,040 | 4/1996 | Moslehi . |
| 5,665,202 | 9/1997 | Subramanian et al. . |
| 5,677,380 | 10/1997 | Matsumura et al. . |
| 5,736,424 | 4/1998 | Prybyla et al. . |

*Primary Examiner*—George Fourson

[57] ABSTRACT

A method for improving the planarity of a layer of material formed on the surface of a topographic substrate, is disclosed. The layer of planarization material formed over the topographic substrate has a first area and a second area. The planarization material in the first area is proximate to the perimeter of the topographic substrate and surrounds the planarization material in the second area. The planarization material in the first area is partially solidified, so that the planarization material in the second area is substantially confined throughout the height of the planarization material in the first area and remains within the perimeter of the topographic substrate when the surface of the layer of planarization material is planarized. The planarization material is planarized by contacting such material with a flat surface of an object with sufficient force to transfer the surface flatness from the flat surface of the object to the layer of planarization material. A release material is optionally placed between the layer of planarization material and the object with the flat surface to facilitate separation of the flat surface of the object from contact with the layer of planarization material after planarization and solidification.

43 Claims, 6 Drawing Sheets

DEVICE FABRICATION INVOLVING SURFACE PLANARIZATION

CROSS-REFERENCE TO RELATED APPLICATIONS

This application is a continuation-in-part of application Ser. No. 08/695,181 filed on Aug. 1, 1996, now U.S. Pat. No. 5,736,181 which is a continuation-in-part of application Ser. No. 08/245,279 filed on May 18, 1994 and now abandoned, which is a continuation-in-part of application Ser. No. 07/593,362 filed Oct. 1, 1990, which is a continuation of application Ser. No. 07/349,975 filed May 8, 1989 and now abandoned which is a continuation of application Ser. No. 07/020,332 filed Feb. 27, 1987, now abandoned. The contents of application Ser. Nos. 08/695,181, 08/245,279, 07/593,362, 07/349,975 and 07/020,332 are hereby incorporated by reference. Application Ser. No. 07/593,362 is the subject of Interference No. 102,814 (Chandross et al. v. Brown). This application claims priority of Provisional Application Ser. No. 60/056,192 which was filed Aug. 19, 1997.

1. FIELD OF THE INVENTION

The present invention relates to device fabrication, and more particularly, to device fabrication requiring the planarization of a nonplanar surface.

2. DESCRIPTION OF THE RELATED ART

In processes for device fabrication, multiple layers are formed sequentially on a substrate. Typically, at least some of these layers are patterned; i.e., the layer is formed over a portion of the substrate. Since the patterned layers do not provide a uniform thickness over the entire surface of the substrate, the surface of these patterned layers is referred to as topographic.

Figure 1:
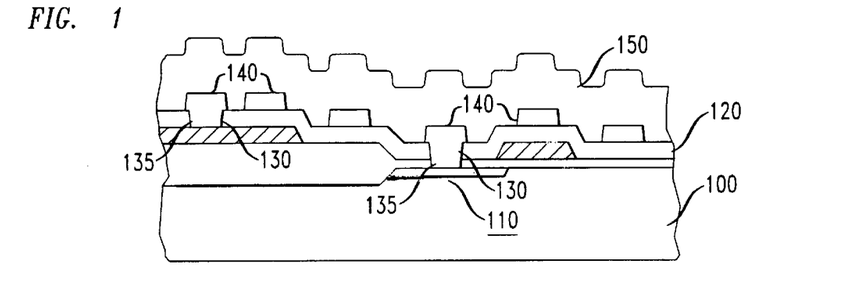
FIG. 1 illustrates the surface topography of a semiconductor device.

Layers that are formed over a topographic surface tend to conform to the underlying topography. As illustrated in FIG. 1, a device 110 is formed on a substrate 100. A layer of dielectric 120 is formed over the device 110. Vias 130 are then formed in the dielectric 120 and filled with metal 135. More metal is then formed over the dielectric 120 on the substrate and is patterned to form the interconnects 140. Another layer of dielectric 150 is then deposited over the interconnects 140. As illustrated by FIG. 1, the surface of the dielectric layer 150 is nonplanar, because the layer conforms somewhat to the underlying topography.

Surface topography presents significant challenges in processes for device fabrication. For example, lithography is frequently used to form a pattern in a layer of material deposited on the substrate surface. In an exemplary lithographic process a layer of energy sensitive resist material (hereinafter referred to as resist material) is formed on the substrate, exposed to radiation in the desired pattern, and developed to reveal the exposed pattern. When a layer of resist material is formed over a topographic surface, the resist material conforms approximately to the underlying topography. In order to obtain the desired pattern in the resist material, the radiation is focused at a specific depth in the thickness of the resist material to obtain an image of the pattern with the desired resolution. Typically, the focus is maintained over a range of depths that is at least about two times the feature width. If the surface of the resist material is not planar, the image of the pattern in the resist will not be in focus across the surface of the wafer and throughout the film thickness. This lack of image focus uniformity degrades the resulting pattern.

Also, surface topography adversely affects device interconnect reliability because a metal layer which is deposited over such surface irregularities has turns or bends which conform to the shape of the irregularity. These bends or turns potentially cause failures of the metal layer due to current crowding. Current crowding occurs when current flowing around a bend or turn in a metal film is confined to a portion of the metal layer, instead of the entire thickness.

To avoid the above-described problems and other problems associated with surface topography in device fabrication, processes have been developed to form a layer with a relatively planar surface over a topographic substrate surface. One such process is a conventional etch-back technique. The conventional etch-back technique is used to smooth the topographic substrate surface by forming a material layer having a less irregular surface over the topographic substrate. The material that is used for this layer is a low viscosity material which is spin coated on the topographic substrate surface. If the substrate surface and the overlying material layer have approximately the same etch rate, etching proceeds through the planarizing material and into the substrate layer, so that the surface configuration of the planarizing layer is transferred into the substrate surface layer.

Figure 2:
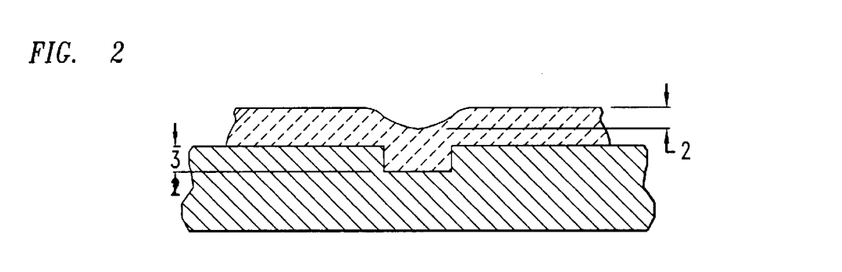
FIG. 2 is a side view of a topographic substrate having a layer of planarization material formed thereon.

Although the conventional etch-back technique is adequate for some applications there is a limit to the degree of planarization provided by this technique. The degree of planarization is defined, with reference to FIG. 2, as the difference between the depth of the topography on the substrate surface $h_t$, as denoted by 3, and the vertical distance between the high point and a low point on the overlying material surface $h_d$, as denoted by 2, divided by the depth of the topography on the substrate surface $h_t$. The degree of planarization, typically reported as a percent, is determined from $$\frac{h_t - h_d}{h_t} \times 100.$$

For most device configurations, the degree of planarization obtained using the above described etch-back technique has generally not been better than approximately 55% for features greater than 100 $\mu$m (micrometers) in width and 0.5 $\mu$m in depth. Such a low degree of planarization is attributed to a lack of planarity in the planarizing material layer that is formed over the topographic substrate. Thus, for elongated gap type features which are greater than about 100 $\mu$m in width and 0.5 $\mu$m in depth, the usefulness of the conventional etch-back technique, is limited.

Another technique, chemical-mechanical polishing (CMP) is also used to obtain a planar surface over irregular substrate surfaces. In the technique of chemical-mechanical polishing, the substrate surface is rubbed across a polishing pad while immersed in an appropriate chemical slurry until the desired degree of planarity is achieved. Although this technique, in principle, yields surfaces that are planar, it requires a high degree of process control to obtain the desired results, due to the degradation of the polishing pad and of the chemical slurry during the polishing process. In addition, because the polishing pad is typically comprised of a flexible material, the polishing pad tends to conform to concave regions on the irregular substrate surface. This prevents the CMP technique from forming a surface having a high degree of planarity, since such concave regions are typically not completely planarized during the polishing step.

Thus, surface planarization techniques useful for device fabrication continue to be sought.

SUMMARY OF THE INVENTION

The present invention is directed to a process for planarizing a layer of material formed over a topographic surface of a substrate. The planarization material is selected to have a viscosity of about 20 cp (centipoise) to about 40,000 cp, during the planarization step. For the purpose of this description, the layer of planarization material formed over the topographic surface of the substrate has a first area and a second area. The first area is proximate to the perimeter of the topographic substrate and surrounds the second area.

In the process of the present invention, the planarization material in the first area is at least partially solidified (hardened), while the planarization material in the second area remains within the specified viscosity range. The planarization material in the first area is at least partially solidified by curing or by some other mechanism which partially solidifies the planarization material. Conditions required to effect the desired degree of solidification depend on the particular planarization material that is applied over the surface of the topographic substrate and are well known to those skilled in the art.

The planarization material in the first area is sufficiently solidified so the planarization material in the second (unsolidified) area is substantially confined throughout the height of the planarization material in the first area, when the surface of the layer of planarization material is subsequently planarized. Confining the second area of planarization material throughout the height of the planarization material in the first area improves the planarity achieved in the layer of planarization material in the second area by preventing substantial amounts of the planarization material from flowing off the substrate during the planarization step.

Once the planarization material in the first area is at least partially solidified, the second area of planarization material is planarized by bringing such planarization material in contact with a flat surface of an object with sufficient force to transfer the surface flatness from the flat surface of the object to the planarization material. The force exerted by the object on the planarization material in the second area causes this planarization material to flow over the topographic features on the substrate, flattening the surface of the layer of planarization material and improving its planarity.

The flat surface of the object is configured to transfer the desired degree of planarity to the planarization material in the second area. The flat surface of the object preferably transfers a degree of planarity of at least about eighty-five percent to the surface of the planarization material. Objects with sufficiently flat surfaces for use in the present process are well known to those skilled in the art. One example of such an object is an optical flat made of fused silica.

After the planarization material in the first area is partially solidified, the average height of the planarization material over the topographic surface in the second area is preferably greater than the average height of the planarization material in the first area. In the context of the present invention, the height of the planarization material is measured relative to the flat surface of the object, correcting for any warpage of the substrate. The average height of the planarization material is greater in the second area in the sense that the top surface is closer on average to the flat surface of the object than the top surface of the planarization material in the first area. When the average height of the first area of planarization material is greater than the average height of the planarization material over the topographic surface in the second area, the planarization material in the second area potentially contacts only a limited portion of the flat surface of the object during the planarization step. If only a portion of the flat surface of the object contacts the planarization material in the second area during the planarization step, the improvement in the planarity of the layer of planarization material is limited. Also, when the substrate is flexible and the average height of the planarization material in the first area is greater than the average height of the planarization material in the second area, the substrate potentially bends during planarization, forming a concave surface in the second area of planarization material.

In one embodiment of the present invention, at least a portion of the planarization material in the first area is removed from the surface of the substrate so the average height of the planarization material in the second area is greater than the average height in the first area. The planarization material in the first area is removed by edge-bead removal before solidification or by some other suitable expedient such as etching before the planarization step. Conditions required to remove the desired amount of planarization material from the first area depend on the particular planarization material that is applied over the surface of the topographic substrate and are readily ascertained by those skilled in the art. The planarization material in the first area is removed prior to planarization.

Prior to planarization, the average height of the unsolidified material in the second area is preferably greater than the average height of the at least partially solidified planarization material in the first area. Consequently, during planarization, there is a tendency for the unsolidified material in the second area to flow over the at least partially solidified planarization material in the first area and off the substrate, in response to the pressure exerted by the flat surface of the object. If a significant amount of planarization material flows off the substrate during planarization, the resulting planarity will be adversely affected. In one embodiment of the present invention, the first area of the substrate is subjected to conditions sufficient to at least partially solidify planarization material flowing from the second area into the first area during the planarization step. The planarization material flowing into the first area from the second area is partially solidified using conventional conditions and techniques. Thus, during the planarization step, the volume of the planarization material in the first area increases as the planarization material flows into the first area from the second area and is partially solidified. As the volume of the at least partially solidified planarization material in the first area increases, the planarization material in the second area is increasingly confined by the planarization material in the first area. Consequently, the amount of planarization material flowing off the substrate is reduced as the volume of the at least partially solidified planarization material in the first area increases.

After the planarization step, the layer of planarization material is solidified while in contact with the flat surface of the object. Upon solidification, the volume of the planarization material is reduced by less than about 10%.

Once the planarization material is solidified, the object and the layer of planarization material are separated from contact. When the object and the planarization material are separated, particles of planarization material potentially adhere to the flat surface of the object. Such particle adhesion has the potential to degrade the planarity of the planarization material. In one embodiment of the present invention, a layer of release material is placed between the flat surface of the object and the planarization material prior to the contacting step. The layer of release material reduces the degree to which particles of planarization material adhere to the flat surface of the object. The layer of release material is optionally formed on the flat surface of the object.

In an alternate embodiment of the present process, the surface of the layer of planarization material is brought in contact with the flat surface of the object before the planarization material in the first area is at least partially solidified. The surface of the layer of planarization material contacts the flat surface of the object with a force such that the planarization material in the second area does not significantly flow. Thereafter, the planarization material in the first area, proximate to the perimeter of the topographic substrate, is at least partially solidified. The planarization material in the second area is subsequently planarized, solidified and separated from contact with the flat surface of the object.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

DETAILED DESCRIPTION

Figure 3:
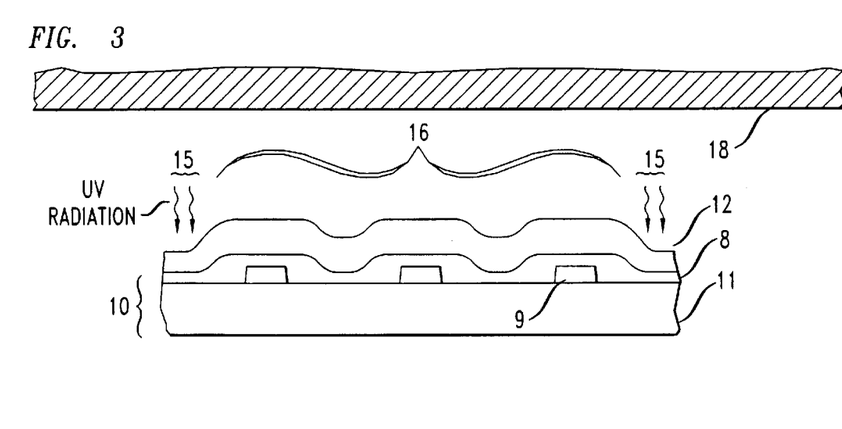
FIGS. 3 and 4 are illustrative of the planarization process of the present invention.

In the present process, a layer of planarization material 12 is formed over a substrate 11 surface, as illustrated in FIG. 3. The layer of planarization material 12 is selected to have a viscosity within the range of about 20 cp (centipoise) to about 40,000 cp, during planarization. Typically, the layer of planarization material 12 is planarized at a temperature of less than about 100° C. The layer of planarization material 12 is formed on the surface of the substrate 11 using conventional techniques such as spin coating.

The substrate 11 has a multilayered structure 10, thereon. At least one layer 9 of the multilayered structure 10 is patterned (i.e., the layer is formed over a portion of the substrate), producing a topographic surface on the substrate 11. Materials useful for forming the multilayered structure 10 include metals 9 such as aluminum and oxides 8 such as silicon dioxide.

For the purpose of this description, the planarization material 12 is defined to have a first area 15 and a second area 16. The planarization material in the first area 15 is coextensive with the perimeter of the topographic substrate 11 and surrounds the planarization material in the second area 16. The width of the first area 15 is preferably less than about 10 mm (millimeters) and most preferably the width of the first area 15 is less than about 3 mm.

In the process of the present invention, the planarization material in the first area 15 is at least partially solidified (hardened), while the planarization material in the second area 16 remains within the specified viscosity range. It is important for the planarization material in the second area 16 to remain within the specified viscosity range after the material in the first area 15 is at least partially solidified, to facilitate planarization when the material in the second area 16 is subsequently planarized.

The planarization material in the first area 15 is at least partially solidified by curing or some other mechanism which partially solidifies such planarization material. Conditions required to effect the desired degree of solidification for the planarization material in the first area 15 depend on the particular planarization material that is applied over the surface of the topographic substrate 11 and are well known to those skilled in the art. For many applications, the planarization material 12 is solidified through exposure to ultraviolet radiation having a wavelength within the range of about 100 nm (nanometers) to about 400 nm.

The planarization material in the first area 15 is sufficiently solidified to substantially confine the second (unsolidified) area 16 of planarization material throughout the height of the planarization material in the first area 15, during the planarization step. Confining the planarization material in the second area 16 throughout the height of the planarization material in the first area 15 improves the planarity achieved in the layer of planarization material by preventing substantial amounts of the planarization material from flowing off the substrate during the planarization step.

Examples of planarization materials include monomers, monomer mixtures, oligomers, oligomer mixtures, and certain low and high molecular weight polymers. Such planarization materials are either solidified by heat, heat in the presence of an acid generator, ultraviolet irradiation, or ultraviolet irradiation in the presence of an acid generator. For example, some of these planarizing materials are solidified by combining the planarization material with an acid generator, which generates acid when heated or irradiated, thus catalyzing the solidification. The specific acid generator used depends upon the planarization material utilized and the conditions for effecting the desired degree of solidification.

Epoxy resins are examples of suitable planarization materials. One example of such an epoxy resin is Dow Epoxy Novolac 431 (DEN-431), available from the Dow Chemical Company. The unsolidified epoxy resin has a viscosity of about 100 cp at a temperature of about 100° C. and is solidified through exposure to ultraviolet radiation when combined with a photoacid generator. Conditions for effecting the complete or at least partial solidification of the DEN-431 epoxy resin are determined based upon the thickness of the layer of DEN-431 epoxy resin, the amount of photoacid generator with which it is combined, as well as the wavelength and the intensity of the ultraviolet radiation. The DEN-431 is typically at least partially solidified through exposure to ultraviolet radiation for times ranging between about 1 to 100 seconds (dependent on the conditions noted above), at a temperature of about 50° C., in the presence of about 3% by weight of an acid catalyst. An example of a suitable acid catalyst is the photoacid generator, triphenyl-sulphonium hexafluorophosphate.

The first area 15 of the planarization material is at least partially solidified using conventional techniques. For example, if the planarization material is solidified through exposure to ultraviolet radiation, one suitable technique is to mask the planarization material in the second area 16, so that only the first area 15 of the planarization material is exposed to the ultraviolet radiation.

Figure 4:
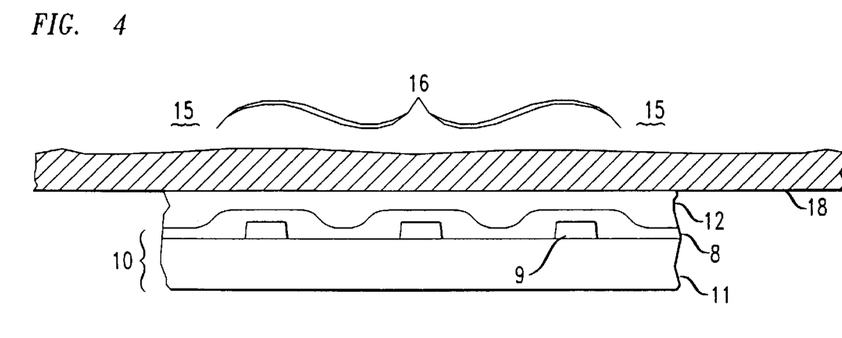

Once the planarization material in the first area 15 is at least partially solidified, the planarization material in the second area 16 is forced into planarity using an object 18 with a flat surface, as shown in FIG. 4. The planarization material in the second area 16 and the flat surface of the object 18 are placed in contact with sufficient force to transfer the surface flatness from the flat surface of the object 18 to the planarization material 12. When the planarization material 12 and the flat surface of the object 18 are placed in contact, the force exerted by the object against the planarization material causes such material to flow over the topographic features on the substrate surface until the surface of the planarization material conforms to the flat surface of the object, thereby forming a surface with the desired planarity.

The time necessary for planarizing the layer of planarization material formed on the topographic surface depends upon factors such as the amount of force used to contact the planarization material with the flat surface of the object, the viscosity of the planarization material, the thickness of the planarization material, etc. Additionally, the time necessary for planarizing the layer of planarization material formed on the surface of the substrate is also affected by the number and location of topographic features that cover the substrate surface. For example, when topographic features are repeated across the surface of the substrate but do not extend to the edges of the substrate (within about 1–20 mm), substantial amounts of planarization material are required to flow large distances (greater than about 1 cm) over the surface of the substrate in order to planarize the surface of the planarization material near the edges of the substrate. Thus, when topographic features are repeated over the substrate surface, it is desirable for the repeated pattern to extend to the near edges of the substrate (within about 1–3 mm), as this reduces the time needed to achieve full substrate planarization.

Figure 5:
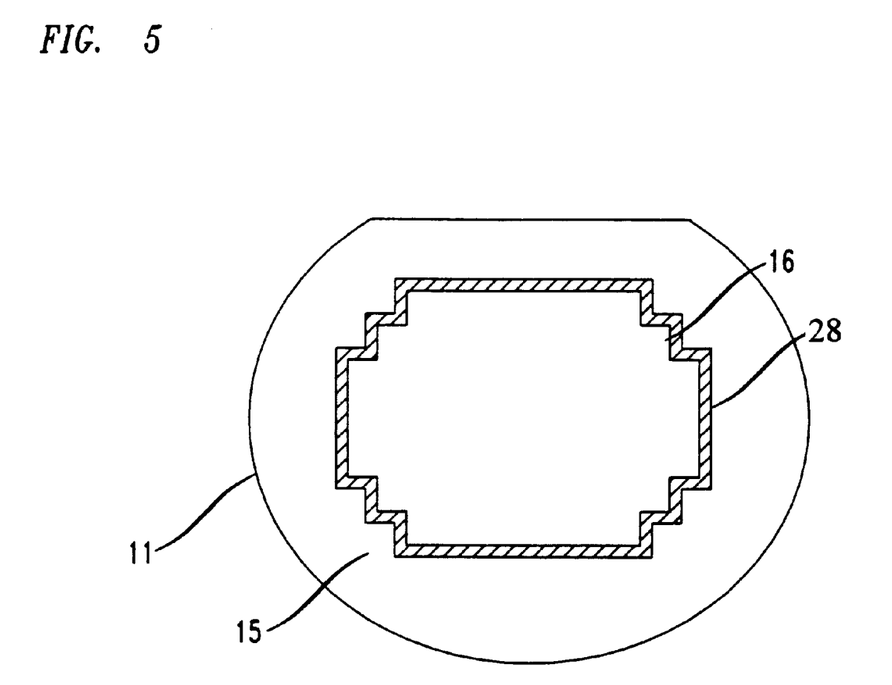
FIG. 5 is a top view of a topographic substrate showing a portion of the planarization material in the first area, coextensive with the perimeter of the second area, at least partially solidified.

Alternatively, the time needed to achieve full planarization of the material in the second area 16 is reduced by at least partially solidifying an area of planarization material that is coextensive with the perimeter of a topographic pattern formed to the edge of the second area of planarization material. For example, FIG. 5 shows a top view of substrate 11 having a layer of planarization material thereover. The layer of planarization material has a first area 15 and a second area 16. A topographic pattern extends to the edge of the second area 16 of planarization material. A portion 28 of the planarization material in the first area 15 that is coextensive with the perimeter of the second area 16 is at least partially solidified. This confines the planarization material in the second area 16 preventing it from significantly flowing into the first area 15 during the planarization step. Confining the planarization material in the second area 16 reduces the time needed to achieve full planarization since the planarization material is not required to flow large distances over the substrate surface in order to planarize the surface of the planarization material near the edges of the substrate. Thus, at least partially solidifying the portion 28 of planarization material in the first area 15 that is coextensive with the perimeter of the second area 16 of planarization material reduces the time needed to achieve fill planarization of the material in the second area 16.

The at least partially solidified portion 28 of the planarization material in the first area 15 that is coextensive with the perimeter of the second area 16 of planarization material preferably has a width of at least about 1 mm and can extend to the edges of the substrate 11. When ultraviolet irradiation is used to at least partially solidify the portion 28 of the planarization material in the first area 15, techniques which photo-mask the planarization material in the second area 16 over the topographic pattern are desirable since then only the planarization material 12 in the first area 15 is at least partially solidified.

Objects 18 having flat surfaces suitable for planarizing the surface of planarization material 12 are well known to those skilled in the art. It is preferable for the flat surface of the object 18 to transfer a degree of planarity of at least about eighty-five percent to planarization material 12, and most preferably to transfer a degree of planarity of about ninety-five percent. Also, it is advantageous for the object to be transparent to ultraviolet radiation, since many planarization materials are typically solidified through exposure to such radiation. One example of an object which transfers a sufficiently flat surface to the layer of planarization material is an optical flat made of fused silica, available from General Optics, Moorpark, Calif. Other materials suited for making the object include sapphire ($Al_2O_3$) or ionic salts such as calcium fluoride ($CaF_2$), magnesium fluoride ($MgF_2$), and sodium chloride (NaCl).

The shape of the object 18 having the flat surface is variable as are its dimensions, however, a thickness:diameter ratio sufficient to form a flat surface having the desired degree of planarity on the layer of planarization material, is required. For example, an optical flat of fused silica having a diameter of about 9 inches and a thickness of about 1.5 inches (which is a thickness:diameter ratio of 1:6), is useful for forming a flat surface having a degree of planarity of at least about eighty-five percent on the layer of planarization material.

The object 18 is preferably affixed within a housing (not shown). Affixing the object within a housing prevents both the vertical and horizontal movement of the object and substrate during the planarization step. The object 18 is optionally cleaned while affixed within the housing (not shown) by rinsing with a solvent and/or a solution Solvents and/or solutions suitable for cleaning the object depend on the particular planarization material used and are readily determined by those skilled in the art.

A plurality of objects 18 with flat surfaces are optionally affixed within the housing (not shown). Such an arrangement permits the planarization material 12 formed on the surface of the substrate 11 to be planarize using a first object, while a second object is cleaned for use in a subsequent planarization step.

The average height of the planarization material 12 over the topographic surface in the second area 16 is preferably higher than the average height of the planarization material in the first area 15. For the purpose of this description, the height of the planarization material is measured relative to the flat surface of the object, correcting for any substrate warpage. The average height of the planarization material in the second area is greater in the sense that the top surface is closer on average to the flat surface of the object than the top surface of the planarization material in the first area. For example, with reference to FIG. 3, the average height of the planarization material in the second area 16 is such that the top surface is closer on average to the flat surface of the object 18 than is the top surface of the planarization material in the first area 15. As such, the solidified planarization material in the first area 15 does not interfere with attaining planarization in the second area 16.

When the average height of the planarization material 12 in the first area 15 is greater than the average height of the planarization material 12 in the second area 16, the planarization material in the second area 16 potentially contacts only a limited portion of the flat surface of the object during the planarization step. If only a portion of the flat surface of the object contacts the planarization material in the second area 16 during the planarization step, the improvement in the planarity of the layer of planarization material is limited. Additionally, when the substrate is flexible and the average height of the planarization material in the first area 15 is greater than the average height of the planarization material in the second area 16, the substrate potentially bends during planarization. If the substrate bends during planarization, a concave surface potentially forms in the second area 16 of the planarization material.

In one embodiment, at least a portion of the planarization material in the first area 15 is removed from the surface of the substrate 11, so the average height of the planarization material 12 in the second area 16 is greater than the average height of the planarization material 12 in the first area 15, as specified above. The planarization material in the first area 15 is removed using conventional techniques well known to those skilled in the art. One example of a suitable technique is called edge-bead removal, in which a solvent dissolves the planarization material proximate to the edges of the topographic substrate before solidification. In an alternative method, at least a portion of the multilayered structure 10 in the first area of the topographic substrate 11 is removed using a technique such as etching. The portion of the multilayered structure is removed as part of the ordinary sequence of fabrication steps so that when the layer of planarization material is formed thereon, the average height of the planarization material in the second area 16 is greater than that of the first area 15.

Since the average height of the planarization material 12 in the second area 16 is greater than the average height of the planarization material in the first area 15, there is a potential for the planarization material in the second area 16 to flow over the at least partially solidified planarization material in the first area 15 and off the substrate during planarization. The planarity achieved in the layer of planarization material 12 is adversely affected if a substantial amount of planarization material in the second area 16 flows off the substrate 11 in this manner.

In one embodiment of the present invention, the planarization material 12 flowing from the second area 16 into the first area 15 during the planarization step is at least partially solidified. Conventional conditions well known to one skilled in the art are used to effect solidification. Conditions sufficient to effect the desired degree of solidification are applied continuously or periodically. For example, if the planarization material is solidified through exposure to ultraviolet radiation, the first area 15 of the substrate is optionally subjected to the ultraviolet radiation at timed intervals for the duration of the planarization step (e.g., DEN 431 at about 50° C. with about 3% by weight of an acid catalyst is typically exposed to about 800 watts of broad band wavelength ultraviolet radiation having a range of about 200 to about 300 nm for about 0.1–0.5 seconds at intervals of about 1–10 seconds), to at least partially solidify the planarization material 12 flowing into the first area 15 from the second area 16. Techniques which mask the planarization material in the second area 16 during the planarization step are desirable so that only the planarization material 12 flowing into the first area 15 is exposed to the ultraviolet radiation and at least partially solidified.

Partially solidifying the planarization material 12 flowing into the first area 15 from the second area 16 increases the volume of the planarization material in the first area 15 that is adjacent to the perimeter of the second area 16. As the volume of the at least partially solidified planarization material 12 in the first area 15 adjacent to the perimeter of the second area 16 increases, the planarization material 12 in the second area 16 is increasingly confined within the perimeter of the first area 15. Confining the planarization material within the increasing volume of the partially solidified planarization material in the first area 15 improves the planarity achieved in the layer of planarization material 12 by preventing the planarization material in the second area 16 from flowing over the at least partially solidified planarization material in the first area 15 and off the substrate 11.

Once the surface of the planarization material in the second area 16 has been planarized, the planarization material layer is solidified so the planarity is retained. The planarization material layer is solidified while in contact with the flat surface of the object 18 using conditions well known to one skilled in the art. The degree to which the planarization material is solidified depends upon the subsequent steps in the device fabrication procedure. For example, if the planarization material is used in an etch-back process, the planarization material must be sufficiently solidified so that it will retain its planarity and so that its etching rate can be made to match that of the underlying material. One skilled in the art will be able to determine to what degree the planarization material should be solidified in a particular application. For many applications, the planarization material is solidified through exposure to ultraviolet radiation, as discussed above.

The planarization material 12 preferably shrinks less than about 10% by volume when solidified. Planarizing materials to which more than 10% by volume of solvent is added to achieve the desired viscosity are not compatible with the present process unless the planarizing material has a viscosity within the desired range, after the solvent is removed. Suitable planarizing materials therefore have a viscosity (either before the solvent is added or after solvent evaporation) that permits it to flow when placed in contact with the flat surface.

After planarization and solidification, the height of the planarization material 12 is preferably greater than the height of the highest topographic feature. Heights on the order of many times the height of the highest topographic feature are not desirable because they require longer times for performing subsequent processing steps (e.g., the etch step used to transfer the surface configuration of the planarization material into the substrate material on the topographic surface). Heights less than the height of the highest topographic feature are also not desirable because the resulting planarity is potentially degraded. Thus, for example, heights greater than about 10 μm (micrometers) over a 2 μm feature, or heights less than the height of the 2 μm feature are generally undesirable.

Figure 6A:
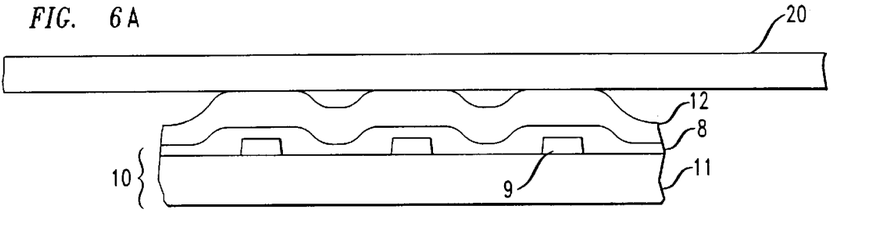
FIGS. 6A and 6B are illustrative of the planarization process of the present invention incorporating a release material for facilitating the separation step.
Figure 6B:
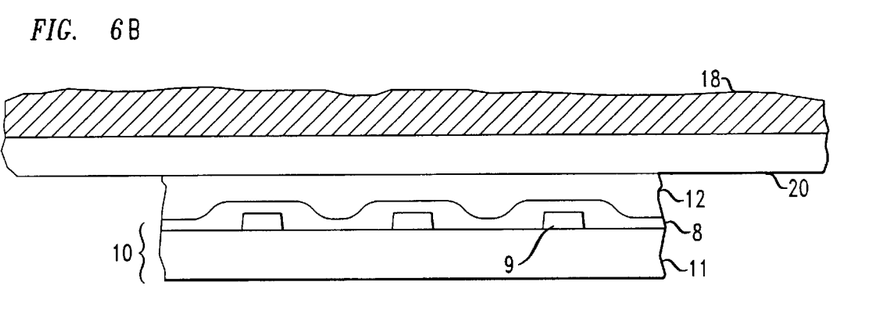

After solidification, the object 18 and the layer of planarization material are separated from contact. When the object and the planarization material are separated, particles of planarizing material potentially adhere to the flat surface of the object This particle adhesion has the potential to degrade the planarity of the planarization material. In one embodiment of the present invention, a layer of release material 20 is placed between the flat surface of the object 18 and the planarization material 12 prior to the contacting step, as shown in FIG. 6A. Thereafter, as illustrated in FIG. 6B, the planarization material 12 is planarized when the flat surface of the object 18 contacts the layer of release material 20 with sufficient force to transfer the surface flatness from the flat surface of the object through the layer of release material 20 into the planarization material 12. The layer of release material reduces the degree to which particles of planarization material adhere to the flat surface of the object.

The layer of release material 20 is a material to which solidified planarization material does not adhere. This lack of adhesion between the planarization material 12 and the layer of release material 20 facilitates the separation step, without degrading the surface planarity of the planarization material 12. The composition of the layer of release material 20 is dependent upon the composition of the planarization material 12. Examples of materials useful as the layer of release material 20 when the planarization material is DEN-431 include fluoropolymers (available from Dupont) and silicone rubber (available from Dow Chemical Co.). Suitable fluoropolymers include teflon and teflon-like materials (e.g., PTFE, FEP and PFA all available from Dupont). Fluoropolymer materials and silicone rubber are desirable because such materials can be cleaned and reused by rinsing with a solvent and/or a solution.

It is advantageous for the layer of release material 20 to be of uniform thickness. A layer of release material 20 that is not adequately uniform will negatively affect the planarity of the planarizing material. However, there is one type of thickness nonuniformity that is acceptable. For example, a wedge-shaped sheet would not negatively affect the planarity of the planarization material when the substrate is supported by a bellows, since the bellows would auto-parallel the wedge-shaped sheet against the flat surface of the object during planarization. Otherwise, the thickness of the layer of release material 20 preferably should not vary by more than about 5000 Å to about 10,000 Å over a 12×12 inch area, more preferably the thickness of the layer of release material does not vary by more than about 3000 Å over the 12×12 inch area, and most preferably the thickness of the layer of release material does not vary by more than about 1000 Å over the 12×12 inch area. Additionally, it is advantageous for the layer of release material 20 to be transparent to ultraviolet radiation for those embodiments where the planarization material is cured by exposure to such radiation.

It is advantageous to place the layer of release material 20 on the planarization material 12. The layer of release material 20 is applied onto the planarization material by bending the edges of the layer of release material 20 so the bottom surface thereof has a convex shape relative to the planarization material 12. Thereafter, the release material 20 is brought into contact with the planarization material 12 in a center-to-edge manner. That is, the center of the layer of release material 20 touches the center of the planarization material 12 with a circular contact area, whose circumference gradually increases as the layer of release material 20 unbends toward the edges of the substrate. Applying the layer of release material 20 on the planarization material in the center-to-edge manner prevents the formation of air pockets between the planarization material 12 and the layer of release material 20.

Alternatively, the flat surface of the object is slightly curved to have a convex shape relative to the planarization material. For example, a 9 inch diameter object can be fabricated out of fused silica to have one flat side and one convex side such that the object is about 1 to about 4 millimeters (mm) thicker at the center than at the edges. When a thin substrate such as a silicon substrate is compressed against the convex side of the object, the substrate contacts the object first in the center and thereafter bends slightly, conforming to the convex shape until contact between both the substrate and the object is complete all the way to their respective edges. This center-to-edge application technique again prevents air entrapment between the object and planarization material on the substrate surface. As long as the pressure applied to the back of the substrate is uniform across the surface and sufficient to cause the substrate to conform to the curved object, this technique will not degrade the final planarity of the layer of planarizing material. Also, a layer of release material is readily integrated into this technique.

In an alternate embodiment, the layer of release material 20 is formed on the flat surface of the object 18. For example, when the planarization material is DEN-431, the flat surface of a cleaned fused silica optical flat is coated with a layer of an alkylhalosilane or a partially fluorinated alkyl silane. A suitable example of an alkylhalosilane is octadecyltrichlorosilane (ODTS). The layer of ODTS is applied onto the flat surface of the object 18 by dipping such flat surface in a solution containing 3% ODTS in n-octane. The thickness of the ODTS layer typically is very uniform and does not vary by more than about 500 Å. In another example, the flat surface of the object 18 is coated with a fluoropolymer such as teflon. A layer of the fluoropolymer is formed on the flat surface of the object 18 by spin coating a colloidal suspension (colloidal suspensions of PTFE, FEP, and PFA are available from Dupont Inc.), chemical vapor deposition (CVD), casting, or laminating techniques all of which are well known to those skilled in the art.

Figure 7:
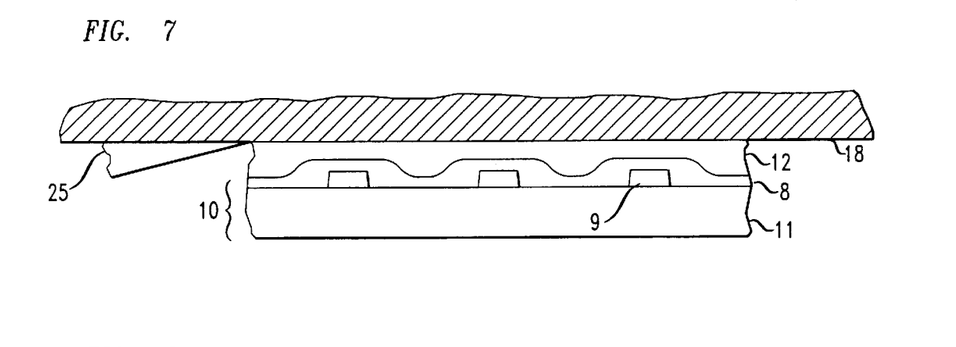
FIG. 7 is illustrative of the planarization process of the present invention wherein a tool separates the flat surface of the object from the planarization material after planarization.

A tool 25 inserted at the interface between the planarization material 12 and the object 18 is used to separate the flat surface of the object 18 (or layer of release material 20 (FIG. 6B), if present) from contact with the planarization material 12, as depicted in FIG. 7. In the embodiment illustrated in FIG. 7, the tool 25 is wedge-shaped and is formed of a material that is non-adherent with respect to the planarization material 12. Also, tool 25 preferably does not cause imperfections to the flat surface of the object 18 or to the surface of the solidified planarization material. Examples of materials suitable for tool 25 include teflon and plastic. Additionally, when the release material 20 (FIG. 6B) is a sheet of teflon or silicone rubber, the planarization material on the substrate is optionally removed from contact with the release material 20 by flexing the ends of the sheet, so the substrate 11 with the layer of planarization material 12 thereon disengages therefrom.

After the planarization material 12 is separated from contact with the flat surface of the object 18 (or release material 20), subsequent steps in the device fabrication procedure are performed. In particular, it is often desirable to transfer the planarity of the surface of the planarization material into the underlying substrate surface. The planarity of the planarization material is transferred by any known technique such as etching using a plasma. As mentioned previously, for the etch-back process, it is advantageous if the etching rate of the planarization material can be made equivalent to the etching rate of the underlying substrate material. One skilled in the art will be able to select suitable etching conditions whereby the solidified planarization material etches at nearly the same rate as the underlying substrate material and to control etch uniformity based on the etching rates for both materials.

Figure 8:
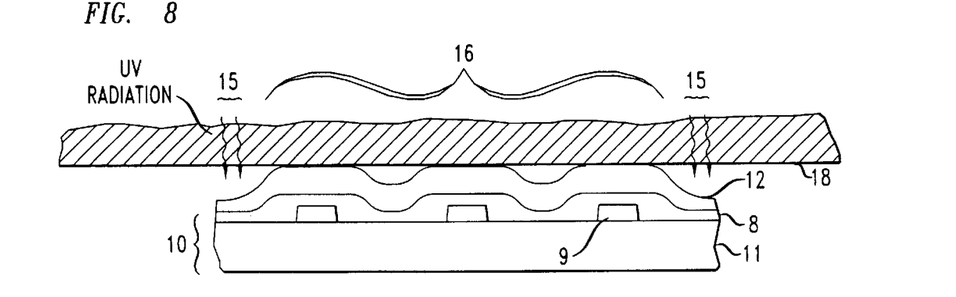
FIG. 8 is illustrative of an alternate embodiment of the present invention wherein the surface of the layer of planarization material is brought in contact with the flat surface of the object before the planarization material in the first area is partially solidified.

In an alternate embodiment of the present process, the surface of the layer of planarization material is contacted with the flat surface of the object before the planarization material in the first area is at least partially solidified. As depicted in FIG. 8, a layer of planarization material 12 is formed on a multilayered topographic substrate 11 surface. The surface of the layer of planarization material 12 contacts the flat surface of the object 18 with a force such that the planarization material does not significantly flow in the second area 16. The planarization material in the second area preferably flows less than about 1–2 mm. For example, when the planarization material is DEN-431 having a viscosity of about 1000 cp at 50° C., applying a pressure of about 10 psi for a time of about 1–10 seconds to the planarization material in the second area causes such planarization material to flow less than about 1–2 mm. Thereafter, the planarization material in the first area 15, proximate to the perimeter of the topographic substrate 11, is at least partially solidified as previously described. The planarization material 12 in the second area 16 is subsequently planarized, hardened and separated from contact with the flat surface of the object 18, as discussed above.

The following examples are exemplary of suitable conditions employed in the inventive procedure.

EXAMPLE 1

A 6 inch diameter silicon wafer having an array of oxide features formed thereon, was obtained. The features were 1×1 cm (centimeter) regions of $SiO_2$, about 5000 Å (angstroms) thick, which provided a topographic surface on the silicon wafer. Each $SiO_2$ feature of the array was separated from an adjacent $SiO_2$ feature by about 1 cm, on each side. The $SiO_2$ features were patterned to a distance of about 2 mm (millimeter) from the edge of the silicon wafer.

Figure 9:
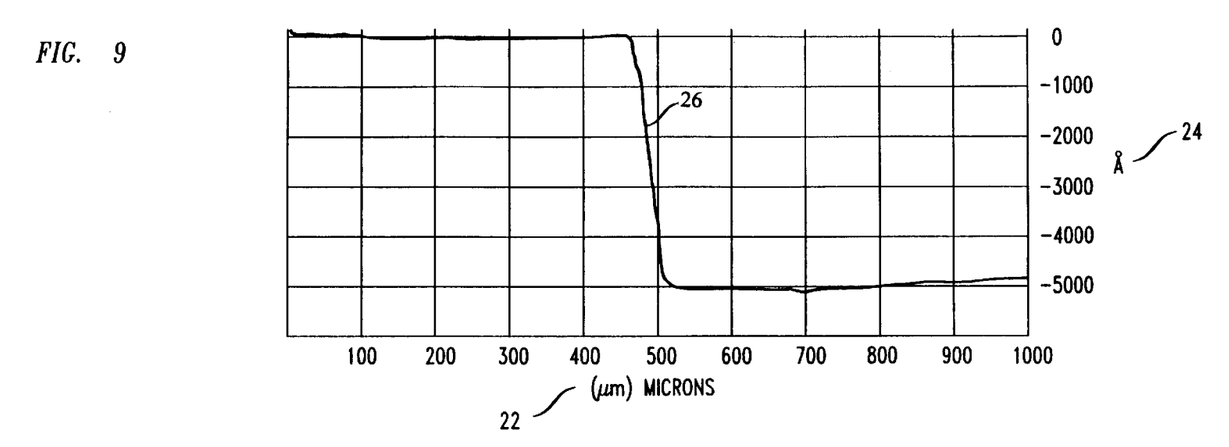
FIG. 9 is an illustration of a profilometer trace of the feature described in Example 1.

The height of the $SiO_2$ features on the topographic surface of the silicon wafer was determined using a profilometer such as the Sloan Dektak Model 3030. In such profilometers, a stylus is moved in a horizontal direction over the topographic features formed on the surface of the wafer. As the stylus is moved, vertical distances (heights) for the topographic features are measured and graphically displayed on a profilometer trace. A profilometer trace for one of the $SiO_2$ features is illustrated in FIG. 9. The axis denoted as 22 measures the distance traveled by the stylus in a horizontal direction across the surface of the silicon wafer and the axis denoted as 24 measures the topographic height of an $SiO_2$ feature formed on the surface of such wafer. The feature edge, denoted as 26 on the trace of FIG. 8, depicts a height of 5000 Å for the $SiO_2$ feature.

A layer of epoxy novolac DEN-431, having a viscosity of about 1000 cp at a temperature of about 50° C., was formed over the topographic features formed on the silicon wafer. The DEN-431 was combined with propylene glycol methyl ether acetate (about 50% by weight) and triphenylsulphonium hexafluorophosphate photoacid generator (about 3% by weight). The DEN-431 was spin-coated over the surface of the patterned silicon wafer. The DEN-431 was spin-coated by pouring the epoxy mixture over the center of the silicon wafer and then spinning the wafer at a speed of about 2000 RPM for approximately 40 seconds to spread the planarization material over the $SiO_2$ features.

The silicon wafer was masked so only an area near the perimeter of the DEN-431 layer, having a width of about 2–3 mm, was partially solidified by exposing this area to ultraviolet radiation. The DEN-431 was exposed for approximately 5 seconds to about 800 watts of ultraviolet radiation from an OAI Model 30-7 mercury-xenon arc lamp that was configured for a 200–400 nm (nanometer) output.

Thereafter, the coated silicon wafer was placed in contact with an optical flat with sufficient force to planarize the layer of DEN-431 that was not already partially solidified. The optical flat which was made of polished fused silica, had a diameter of about 9 inches and a thickness of about 1.5 inches. The optical flat was obtained from General Optics of Moorpark, Calif. Before contacting the optical flat with the DEN-431, the optical flat was cleaned by immersing it in a heated solution of sulfuric acid and hydrogen peroxide maintained at 100° C., rinsed with deionized water, and coated with a layer of octadecyltrichlorosilane (ODTS). The layer of ODTS was formed by dipping the optical flat in a solution containing 3% ODTS in n-octane for about 1 minute.

After compression planarization, the DEN-431 was solidified by exposing it to ultraviolet radiation. The DEN-431 was solidified while still contacted to the optical flat. The ultraviolet radiation was transmitted onto the surface of the DEN-431 through the uv transparent optical flat. The DEN-431 was exposed for about 20–30 seconds to ultraviolet radiation from the mercury-xenon lamp described above.

Figure 10:
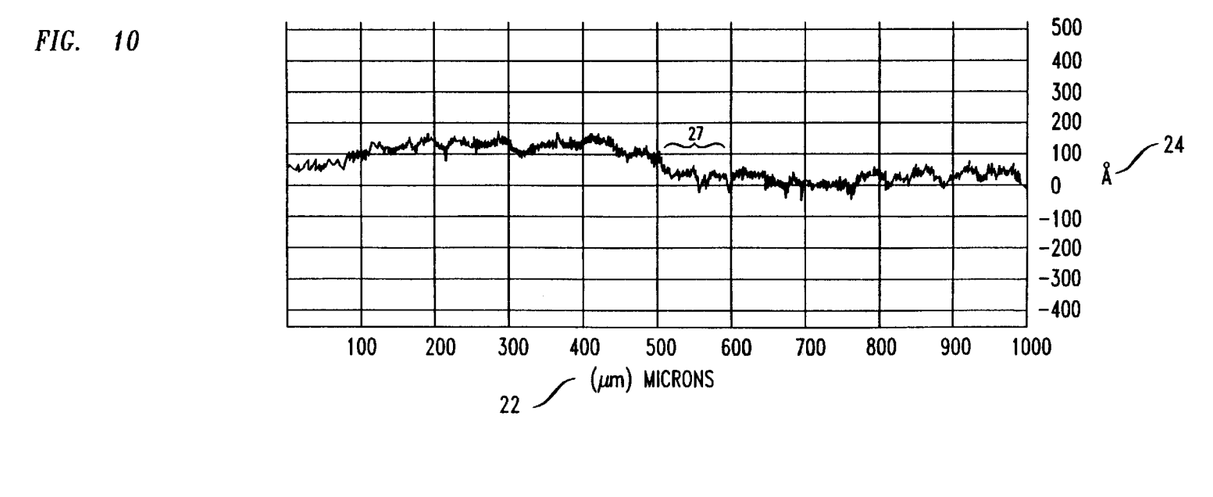
FIG. 10 is an illustration of a profilometer trace of the feature in FIG. 9 with a planarized layer formed thereon.

After the planarization material was solidified, the optical flat was removed from contact with the DEN-431. The coated silicon wafer was analyzed to determine the degree of planarity achieved over the topographic surface. FIG. 10 is a profilometer trace of the feature that was previously scanned to obtain the trace of FIG. 9. A comparison of the traces illustrated in FIGS. 9 and 10 shows that the 5000 Å step, denoted as 26 in FIG. 9, was reduced to a step of about 100 Å, denoted as 27 in FIG. 10, which provides a degree of planarity approximating 98%.

EXAMPLE 2

Figure 11:
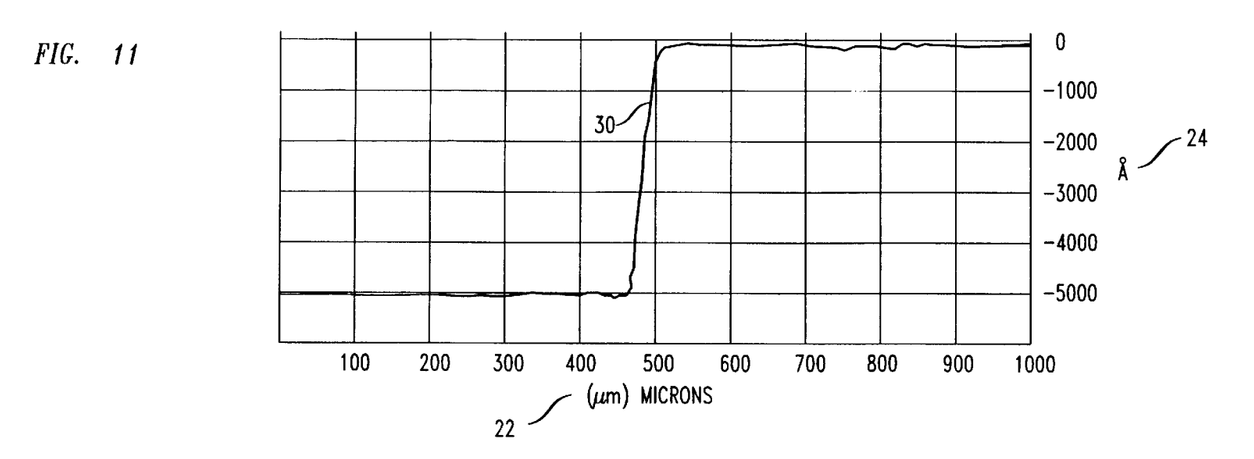
FIG. 11 is an illustration of a profilometer trace of the feature described in Example 2.

A 6 inch silicon wafer was prepared having topographic features as described in Example 1. A profilometer trace for the $SiO_2$ features is illustrated in FIG. 11. The feature edge, denoted as 30 on the trace of FIG. 11, depicts a height of 5000 Å for such $SiO_2$ feature.

The silicon wafer was coated with DEN-431 and the area proximate to the perimeter was partially cured using the materials and conditions described in Example 1. A 9 inch diameter disk of FEP teflon having a thickness of about 0.02 inches was placed between the optical flat and the layer of DEN-431. The thickness of the teflon disk did not vary by more than about 1000 Å over the 9 inch diameter. Thereafter, the layer of DEN-431 was planarized and solidified using the same conditions described in Example 1.

Figure 12:
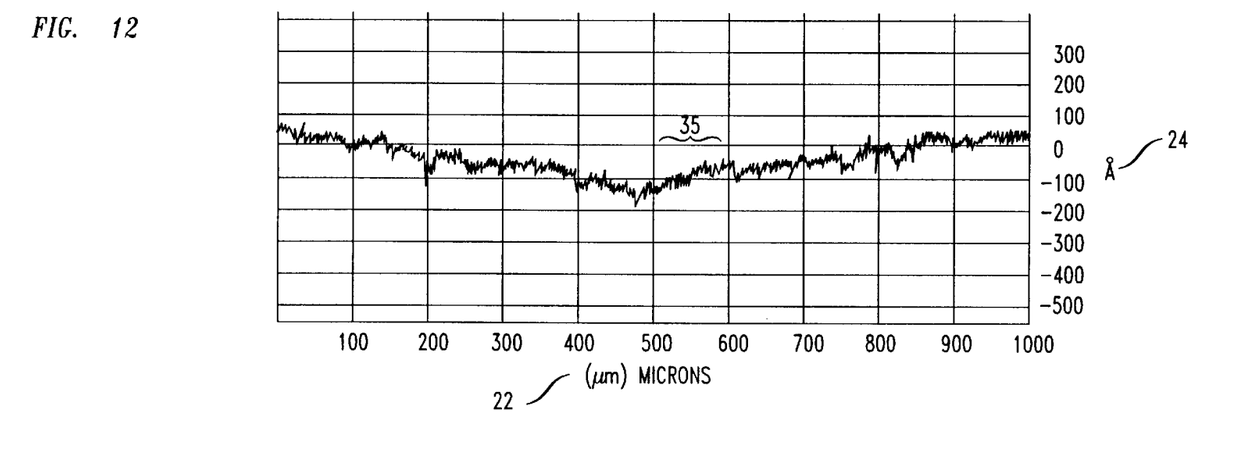
FIG. 12 is an illustration of a profilometer trace of the feature in FIG. 11 with a planarized layer formed thereon.

After the DEN-431 was solidified, the optical flat was removed from contact with the teflon film, and the teflon film was removed from contact with the DEN-431. The coated silicon wafer was analyzed to determine the degree of planarity achieved over the wafer surface. FIG. 12 is a profilometer trace of the feature that was previously scanned to obtain the trace of FIG. 11. A comparison of the traces illustrated in FIGS. 11 and 12 shows that the 5000 Å step, denoted as 30 in FIG. 11, was reduced to a step of about 100 Å, denoted as 35 in FIG. 12, which provides a degree of planarity approximating 98%.

EXAMPLE 3

Figure 13:
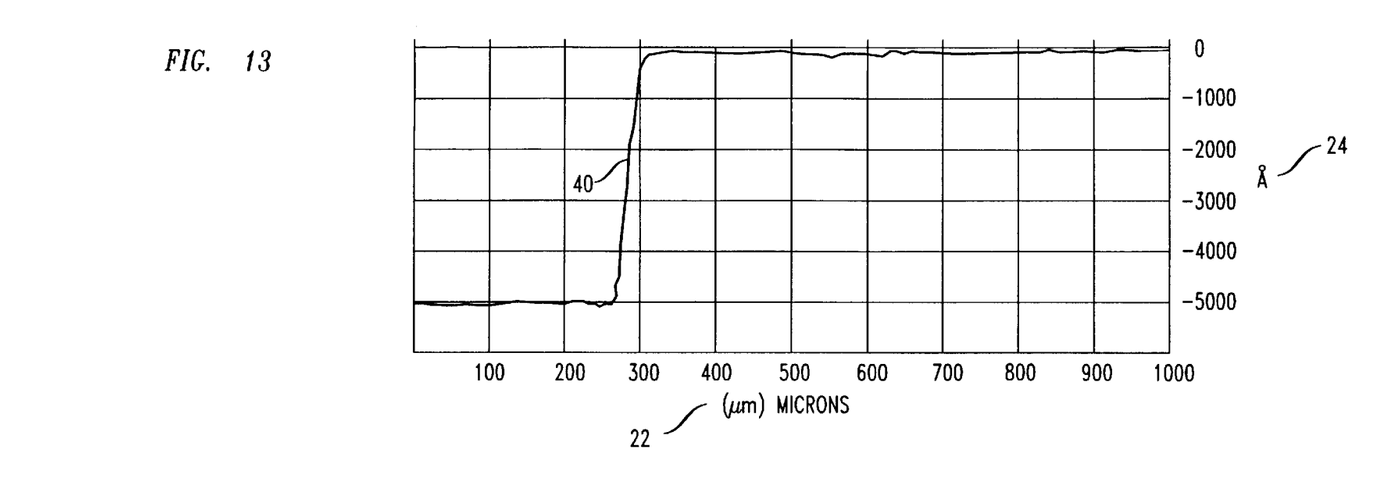
FIG. 13 is an illustration of a profilometer trace of the feature described in Example 3.

A 6" silicon wafer was prepared having topographic features as described in Example 1. A profilometer trace for the SiO$_2$ features is illustrated in FIG. 13. The feature edge, denoted as 40 on the trace of FIG. 13, depicts a height of 5000 Å for such SiO$_2$ feature.

The silicon wafer was coated with DEN-431 using the materials and conditions described in Example 1. Thereafter, the layer of DEN-431 was placed in contact with an optical flat with a force such that the layer of DEN-431 did not significantly flow. While in contact with the flat surface of the object, a 2–3 mm width measured around the perimeter of the layer of DEN-431 was partially solidified, according to the conditions described in Example 1.

Figure 14:
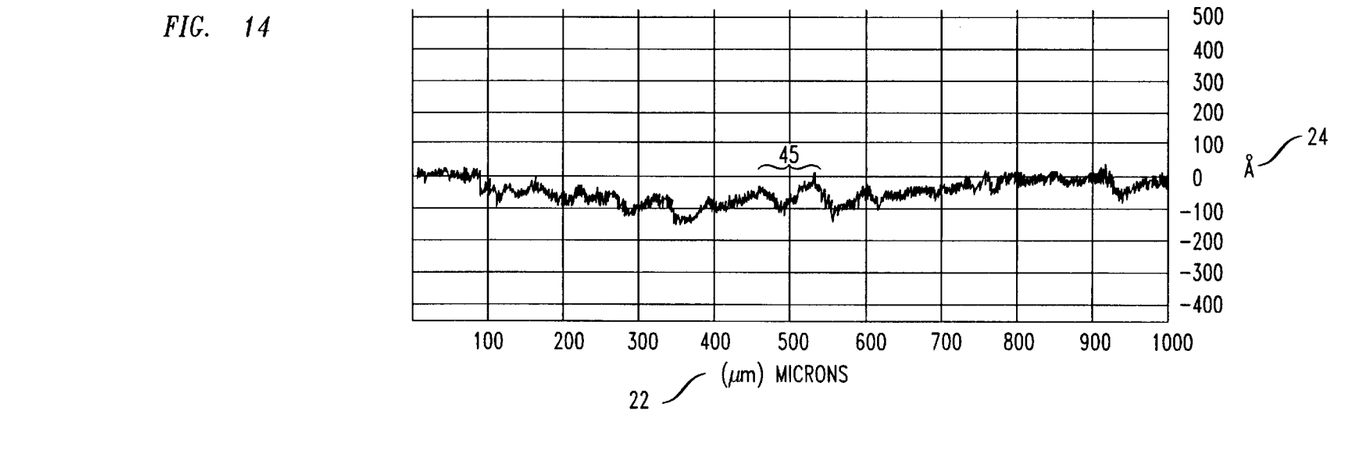
FIG. 14 is an illustration of a profilometer trace of the feature in FIG. 13 with a planarized layer formed thereon.

The DEN-431 was subsequently planarized and solidified according to the conditions used in Example 1. The optical flat was thereafter removed from contact with the DEN-431. The coated silicon wafer was analyzed to determine the degree of planarity achieved over the wafer surface. FIG. 14 is a profilometer trace of the feature that was previously scanned to obtain the trace of FIG. 13. A comparison of the traces illustrated in FIGS. 13 and 14 shows that the 5000 Å step, denoted as 40 in FIG. 13, was reduced to a step of about 100 Å, denoted as 45 in FIG. 14, which provides a degree of planarity approximating 98%.

The invention claimed is:

1. A process for fabricating a semiconductor device, comprising the steps of:

forming a layer of planarization material on a topographic substrate surface wherein the planarization material has a viscosity of about 20 cp (centipoise) to about 40,000 cp during planarization;

at least partially solidifying a first area of the layer of planarization material wherein the first area is proximate to the perimeter of the layer of planarization material and substantially surrounds a second area of the layer of planarization material;

contacting the layer of planarization material with a flat surface of an object with sufficient force to substantially transfer the surface flatness from the flat surface of the object to the layer of planarization material wherein the planarization material in the first area is sufficiently solidified to substantially confine the planarization material in the second area throughout the height of the planarization material in the first area when the object with the flat surface is placed in contact therewith;

solidifying the layer of planarization material while in contact with the flat surface of the object wherein the planarization material undergoes a reduction in volume of less than about 10%; and separating the flat surface of the object from contact with the layer of planarization material.

2. The process of claim 1 wherein contacting the layer of planarization material with the flat surface of the object causes at least a portion of the planarization material to flow from the second area into the first area and further comprising subjecting the first area of the topographic substrate surface to conditions sufficient to at least partially solidify the planarization material that flows from the second area into the first area.

3. The process of claim 2 wherein the planarization material that flows from the second area into the first area during the contacting step is at least partially solidified by exposure to ultraviolet radiation.

4. The process of claim 1 wherein the viscosity of the planarization material in the second area is not substantially increased by the at least partial solidification of the planarization material in the first area.

5. The process of claim 1 wherein the average height of the layer of planarization material formed on the topographic substrate is greater in the second area than in the first area.

6. The process of claim 1 further comprising removing at least a portion of the planarization material in the first area, prior to contacting the layer of planarization material with the flat surface of the object.

7. The process of claim 6 wherein the planarization material in the first area is removed using a technique selected from the group consisting of edge bead removal and etching.

8. The process of claim 1 further comprising reducing the thickness of at least a portion of the topographic substrate surface in the first area, prior to forming the layer of planarization material thereon.

9. The process of claim 1 wherein the first area is a strip of planarization material that is coextensive with the perimeter of the layer of planarization material and has a width less than about 10 mm (millimeters) wide.

10. The process of claim 9 wherein the width of the strip is less than about 3 mm (millimeters) wide.

11. The process of claim 1 wherein the planarization material is solidified by exposure to ultraviolet radiation.

12. The process of claim 1 further comprising placing a layer of release material between the layer of planarization material and the flat surface of the object prior to contacting the layer of planarization material with the flat surface of the object.

13. The process of claim 12 wherein the layer of release material is selected from the group consisting of a fluoropolymer and silicone rubber.

14. The process of claim 12 wherein the layer of release material is formed on the flat surface of the object.

15. The process of claim 12 wherein the layer of release material is applied on the layer of planarization material.

16. The process of claim 15 wherein the layer of release material is a sheet and the sheet is applied onto the layer of planarization material using a center-to-edge technique.

17. The process of claim 1 wherein the flat surface of the object is separated from contact with the layer of planarization material using a tool.

18. The process of claim 17 wherein the tool is made from a material selected from the group consisting of teflon and plastic.

19. The process of claim 12 wherein the layer of release material is separated from contact with the layer of planarization material by flexing the edges of the release material.

20. The process of claim 1 wherein the layer of planarization material is formed on the topographic substrate surface by spin-coating.

21. The process of claim 1 wherein topographic features are repeated over the surface of the substrate to within a distance less than about 2–3 mm (millimeters) from the edge of the substrate.

22. The process of claim 1 wherein topographic features extend to the edges of the second area and wherein a portion of the first area that is coextensive with the perimeter of the second area is at least partially solidified.

23. The process of claim 22 wherein the portion of the first area that is coextensive with the perimeter of the second area has a width greater than about 1 mm.

24. A process for fabricating a semiconductor device, comprising the steps of:

forming a layer of planarization material on a topographic substrate surface wherein the planarization material has a viscosity of about 20 cp (centipoise) to about 40,000 cp during planarization;

contacting the layer of planarization material with a flat surface of an object with a force such that the layer of planarization material does not significantly flow, except near the edges of the substrate;

at least partially solidifying a first area of the layer of planarization material wherein the first area is proximate to the perimeter of the layer of planarization material and substantially surrounds a second area of the layer of planarization material;

contacting the layer of planarization material with the flat surface of the object with sufficient force to substantially transfer the surface flatness from the flat surface of the object to the layer of planarization material, wherein the planarization material in the first area is sufficiently solidified to substantially confine the planarization material in the second area throughout the height of the planarization material in the first area when the object with the flat surface is placed in contact therewith;

solidifying the layer of planarization material while in contact with the flat surface of the object wherein the planarization material undergoes a reduction in volume of less than about 10%; and separating the flat surface of the object from contact with the layer of planarization material.

25. The process of claim 24 wherein contacting the layer of planarization material with the flat surface of the object causes at least a portion of the planarization material to flow from the second area into the first area and further comprising subjecting the first area of the topographic substrate surface to conditions sufficient to at least partially solidify the planarization material that flows from the second area into the first area.

26. The process of claim 24 wherein the planarization material that flows from the second area into the first area during the contacting step is at least partially solidified by exposure to ultraviolet radiation.

27. The process of claim 24 wherein the viscosity of the planarization material in the second area is not substantially increased by the at least partial solidification of the planarization material in the first area.

28. The process of claim 24 wherein the average height of the layer of planarization material formed on the topographic substrate is greater in the second area than in the first area.

29. The process of claim 24 further comprising removing at least a portion of the planarization material in the first area, prior to contacting the layer of planarization material with the flat surface of the object with the force such that the layer of planarization material does not significantly flow.

30. The process of claim 29 wherein the planarization material in the first area is removed using a technique selected from the group consisting of edge bead removal and etching.

31. The process of claim 24 further comprising reducing the thickness of at least a portion of the topographic substrate surface in the first area, prior to forming the layer of planarization material thereon.

32. The process of claim 24 wherein the first area is a strip of planarization material that is coextensive with the perimeter of the layer of planarization material and has a width less than about 10 mm (millimeters) wide.

33. The process of claim 32 wherein the width of the strip is less than about 3 mm (millimeters) wide.

34. The process of claim 24 wherein the planarization material is solidified by exposure to ultraviolet radiation.

35. The process of claim 24 further comprising placing a layer of release material between the layer of planarization material and the flat surface of the object prior to contacting the layer of planarization material with the flat surface of the object with the force such that the layer of planarization material does not significantly flow.

36. The process of claim 35 wherein the layer of release material is made from a material selected from the group consisting of a fluoropolymer and silicone rubber.

37. The process of claim 35 wherein the layer of release material is formed on the flat surface of the object.

38. The process of claim 35 wherein the layer of release material is applied on the layer of planarization material.

39. The process of claim 38 wherein the layer of release material is a sheet and the sheet is applied onto the layer of planarization material using a center-to-edge technique.

40. The process of claim 35 wherein the layer of release material is separated from contact with the layer of planarization material by flexing the edges of the release material.

41. The process of claim 24 wherein topographic features are repeated over the surface of the substrate to within a distance less than about 2–3 mm (millimeters) from the edge of the substrate.

42. The process of claim 24 wherein topographic features extend to the edges of the second area and wherein a portion of the first area that is coextensive with the perimeter of the second area is at least partially solidified.

43. The process of claim 42 wherein the portion of the first area that is coextensive with the perimeter of the second area has a width greater than about 1 mm.

* * * * *